United States Patent
Canumalla et al.

(10) Patent No.: US 8,958,448 B2
(45) Date of Patent: Feb. 17, 2015

(54) THERMAL MANAGEMENT IN LASER DIODE DEVICE

(71) Applicant: Microsoft Corporation, Redmond, WA (US)

(72) Inventors: Sridhar Canumalla, Sammamish, WA (US); Stephen McNally, Snoqualmie, WA (US)

(73) Assignee: Microsoft Corporation, Redmond, WA (US)

( * ) Notice: Subject to any disclaimer, the term of this patent is extended or adjusted under 35 U.S.C. 154(b) by 14 days.

(21) Appl. No.: 13/758,804

(22) Filed: Feb. 4, 2013

(65) Prior Publication Data

US 2014/0219302 A1     Aug. 7, 2014

(51) Int. Cl.
| | | |
|---|---|---|
| H01S 3/04 | (2006.01) |
| H01S 5/024 | (2006.01) |
| H01L 21/82 | (2006.01) |
| H01S 5/022 | (2006.01) |
| H01S 5/062 | (2006.01) |
| H01S 5/40 | (2006.01) |

(52) U.S. Cl.
CPC ............ H01S 5/024 (2013.01); H01L 21/82 (2013.01); H01S 5/02248 (2013.01); H01S 5/02407 (2013.01); H01S 5/02469 (2013.01); H01S 5/06226 (2013.01); H01S 5/40 (2013.01)
USPC .......................................................... 372/36

(58) Field of Classification Search
CPC ....................................................... H01S 3/045
USPC ................................ 372/34, 35, 36; 361/708
See application file for complete search history.

(56) References Cited

U.S. PATENT DOCUMENTS

| | | |
|---|---|---|
| 4,752,109 A | 6/1988 | Gordon et al. |
| 4,901,324 A | 2/1990 | Martin |
| 6,285,476 B1 | 9/2001 | Carlson et al. |
| 7,235,880 B2 | 6/2007 | Prokofiev |

(Continued)

FOREIGN PATENT DOCUMENTS

| | | |
|---|---|---|
| JP | 11185273 | 7/1999 |
| WO | 2012015724 A1 | 2/2012 |
| WO | 2012154510 A3 | 11/2012 |

OTHER PUBLICATIONS

Johnson, Lawrence A., "Controlling Temperatures of Diode Lasers Thermoelectrically", Retrieved at <<http://www.ilxlightwave.com/appnotes/AN%201%20REV01%20Controlling%20Temperatures%20of%20LD%20Thermoelectrically.pdf>>, Retrieved Date: Oct. 1, 2012, pp. 11.

(Continued)

Primary Examiner — Tuan Nguyen
(74) Attorney, Agent, or Firm — Gregg Wisdom; Judy Yee; Micky Minhas

(57) ABSTRACT

Embodiments are disclosed that relate to reducing inductive losses and controlling driver and laser diode temperatures in an optical assembly comprising a laser diode. For example, one disclosed embodiment provides an optical assembly comprising a printed circuit board, and a laser diode package and laser diode driver mounted to the printed circuit board. Further, a heat sink is coupled to the laser diode driver and configured to provide a first thermal path for conducting heat from the laser diode driver. Additionally, a coupler may further be coupled to the laser diode package and printed circuit board, wherein the coupler is configured to provide a second, different thermal path for conducting heat from the laser diode package.

19 Claims, 6 Drawing Sheets

(56) References Cited

U.S. PATENT DOCUMENTS

| | | | |
|---|---|---|---|
| 8,034,645 | B2 | 10/2011 | Lin et al. |
| 8,188,488 | B2 | 5/2012 | Andrews et al. |
| 8,199,787 | B2 | 6/2012 | Deri et al. |
| 8,201,968 | B2 | 6/2012 | Maxik et al. |
| 8,254,422 | B2 | 8/2012 | Datta et al. |
| 8,320,621 | B2 | 11/2012 | McEldowney |
| 2003/0159844 | A1 | 8/2003 | Wolf et al. |
| 2004/0031272 | A1 | 2/2004 | Mecherle et al. |
| 2004/0136099 | A1 | 7/2004 | Kim et al. |
| 2006/0018098 | A1 | 1/2006 | Hill et al. |
| 2006/0088254 | A1 | 4/2006 | Mohammed |
| 2007/0158799 | A1 | 7/2007 | Chiu et al. |
| 2009/0086455 | A1* | 4/2009 | Sakamoto et al. ............ 361/796 |
| 2009/0116251 | A1 | 5/2009 | Harbers et al. |
| 2011/0019416 | A1* | 1/2011 | Poissonnet et al. ...... 362/249.02 |
| 2012/0050991 | A1 | 3/2012 | Tamanuki |
| 2012/0293625 | A1 | 11/2012 | Schneider et al. |
| 2013/0022069 | A1 | 1/2013 | Lee et al. |

OTHER PUBLICATIONS

"Laser Cooling for to Packages using Embedded Thin-Film Thermoelectric Coolers", Retrieved at <<http://www.nextreme.com/media/pdf/Nextreme_Laser_Diode_Cooling_Test_Report_Jan10.pdf>>, Jan. 2010, pp. 8.

"Thermoelectric Cooling Systems Design Guide", Retrieved at <<http://www.marlow.com/media/marlow/images/Downloads/TEC%20Design%20Guide.pdf>>, Retrieved Date: Oct. 1, 2012, pp. 21.

"3DV Systems: ZCam—Depth Camera", Optoelectronic Notes, http://ntuzhchen.blogspot.tw/2011/04/3dv-systems-zcam-depth-camera.html, Apr. 6, 2011, 5 pages.

Bovatsek, Jim et al., "Ultraviolet Lasers: UV Lasers Improve PCB Manufacturing Processes", LaserFocusWorld, International Resource for Technology and Applications in the Global Photonics Industry, http://www.laserfocusworld.com/articles/print/volume-48/issue-11/features/uv-lasers-improve-pcb-manufacturing-processes.html, Nov. 1, 2012, 6 pages.

Colaco, Andrea et al., "3dim: Compact and Low Power Time-of-Flight Sensor for 3D Capture Using Parametric Signal Processing", MIT, http://www.rle.mit.edu/stir/documents/ColacoKGMWG_IISW2013.pdf, Jun. 15, 2013, 4 pages.

Jiang, Guosheng et al., "Understanding of Laser, Laser Diodes, Laser Diode Packaging and Its Relationship to Tungsten Copper", Proceedings of Advanced Thermal Management Materials, http://www.torreyhillstech.com/Documents/Laser_package_white_paper.pdf, Sep. 7, 2012, 18 pages.

Mercado, Emmanuel, "Low-Temperature Characterization of a 1.55-um Multiple-Quantum-Well Laser Down to 10 K", In Thesis of Master of Science Optical Science and Engineering, University of New Mexico, http://repository.unm.edu/bitstream/handle/1928/23201/Revised%20FINAL.pdf?sequence=1, May 2013, 91 pages.

"Optical Components", Finisar, http://www.finisar.com/products/optical-components/High-Powered-VCSELs/HVS7000-001, Available as early as Feb. 24, 2013, 1 page.

Pritsch, Benedikt et al., "High-Power IR Laser in SMT Package", Proceedings of the SPIE 2009, vol. 7198, International Society for Optics and Photonics, http://144.206.159.178/ft/CONF/16426345/16426360.pdf, Feb. 23, 2009, 9 pages.

"Processing and Characterization of Module to Heatspreader Interface", http://scholarlib.vt.edu/theses/available/etd-0107100-102125/unrestricted/ch4.pdf, Jul. 21, 2003, 38 pages.

Seurin, Jean-Francois et al., "Efficient Vertical-Cavity Surface-Emitting Lasers for Infrared Illumination Applications", Proceedings of the SPIE the International Society for Optical Engineering, http://www.princetonoptronics.com/pdfs/7952-15.pdf, Feb. 13, 2011, 10 pages.

ISA European Patent Office, International Search Report and Written Opinion for International Patent Application No. PCT/US2014/013467, Apr. 28, 2014, 14 pages.

Masalkar, Prafulla, "Vcsel Array for a Depth Camera", U.S. Appl. No. 14/177,157, filed Feb. 10, 2014, 29 pages.

* cited by examiner

THERMAL MANAGEMENT IN LASER DIODE DEVICE

BACKGROUND

Laser diodes may be used in various environments, some of which involve toggling the laser diode on and off in rapid succession. For example, a time of flight depth camera may utilize one or more laser diodes that are pulsed at a high frequency for measuring depth based upon how much time it takes light to reflect from an object and then return to the camera. However, such high frequency oscillation may lead to inductive losses. Further, a laser diode and an associated driver circuit may dissipate a significant amount of heat during such use.

SUMMARY

Embodiments are disclosed that relate to inductive loss mitigation and thermal management in an optical assembly comprising a laser diode. For example, one disclosed embodiment provides an optical assembly comprising a printed circuit board, and a laser diode package and laser diode driver mounted to the printed circuit board. Further, a heat sink is coupled to the laser diode driver and configured to provide a first thermal path for conducting heat from the laser diode driver. Additionally, a coupler is coupled to the laser diode package and printed circuit board to provide a second, different thermal path for conducting heat from the laser diode package.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As described above, the high frequency oscillation of a laser diode may give rise to inductive losses and also may produce significant heat. Inductive losses may be lessened by decreasing a distance between a driver circuit and a laser diode. However, decreasing the distance may result in higher operating temperatures as both heat from the diode and heat from the driver circuit are dissipated within a relatively small volume of space.

As such, embodiments are disclosed that relate to reducing inductive losses while controlling heat dissipation in an optical assembly comprising a laser diode. For example, in some embodiments, an optical assembly may include a laser diode package positioned on an opposite side of a printed circuit board as a laser diode driver, such that current from the driver travels little more than the thickness of the circuit board to reach the laser diode. Further, the laser diode package is coupled to a coupler that conducts heat dissipated by the laser diode in a path around an edge of the printed circuit board to a location on a heat sink that is spaced from a location at which the heat sink receives heat from the laser diode driver. Accordingly, heat from the laser diode package may substantially follow a different thermal path for dissipation than heat from the driver, even with the laser diode driver placed in close proximity to the laser diode package to achieve a desired low inductance.

The use of separate thermal paths to dissipate heat from a laser diode and driver circuit mounted on opposite sides of a circuit board may provide increased thermal efficiency while maintaining a low thermal resistance to the heat sink, in comparison to optical assemblies having coupled thermal paths and/or thermal paths that are arranged in close proximity with one another. Further, the close proximity of the laser diode driver to the leads of the laser diode package may provide lower inductance for high speed signaling and control in comparison with optical assemblies having a laser diode driver that is spaced from a laser diode package. The configuration may further provide EMI shielding and enable the removal of a thermoelectric cooler in the thermal solution in order to increase cost effectiveness in comparison with other configurations. Further, the optical assembly may include elements to assist in mounting the laser diode package, the laser diode driver, the coupler, and the heat sink to the printed circuit board and/or one another. Accordingly, the optical assembly may enable optomechanical pointing and increase placement accuracy in comparison with other configurations that omit such elements.

Figure 1:
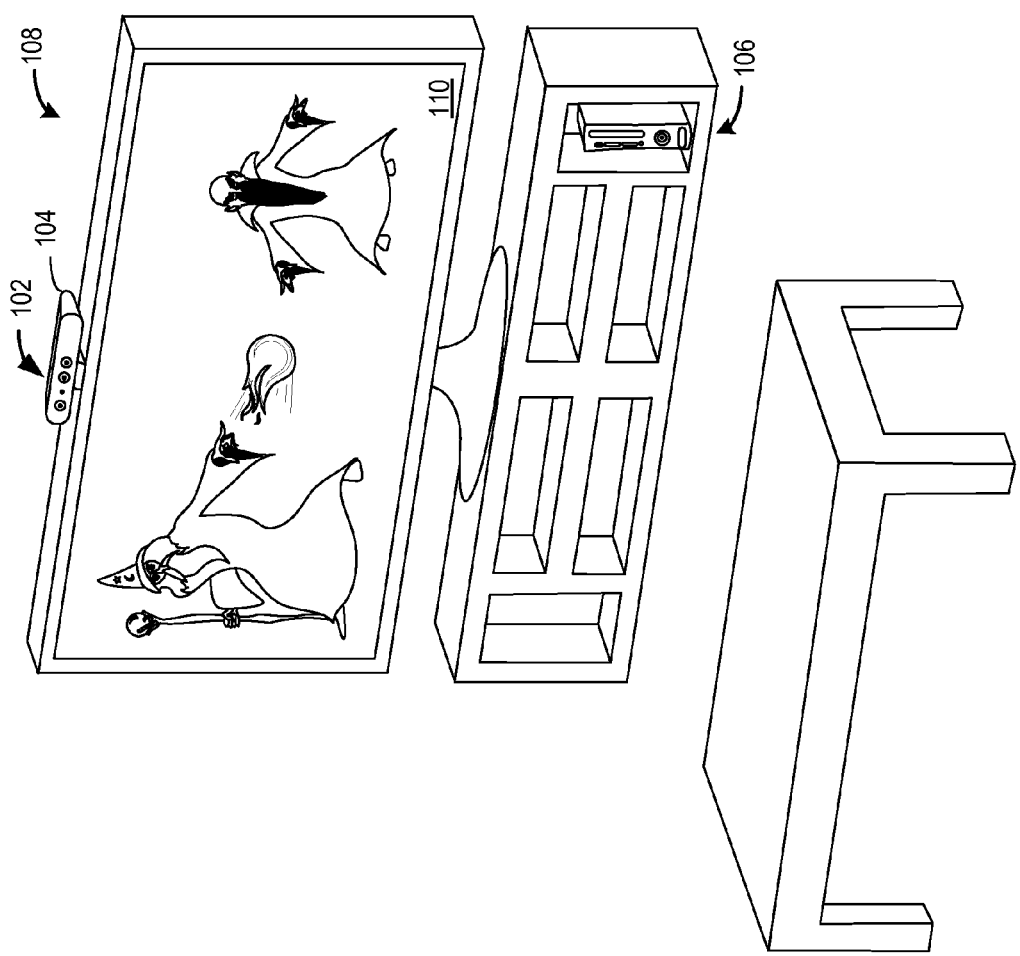
FIG. 1 shows an example optical device in accordance with an embodiment of the present disclosure.
Figure 1:
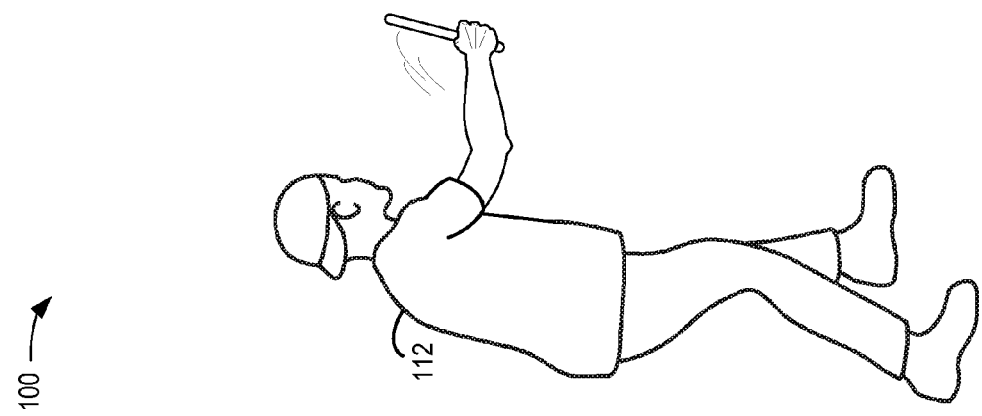

FIG. 1 shows an example use environment 100 for an embodiment of an optical device 102 in the form of a depth camera 104. As mentioned above, a depth camera may project high frequency pulses of light via one or more laser diodes into the environment to measure the time taken for the pulses to return, such that depth may be determined from the return time. It will be understood that some depth cameras may utilize other technologies than so-called "time of flight" depth sensing. For example, some cameras may project a structured light pattern (e.g. via diffraction of light from a laser diode), and then measure depth from distortions of the structured light pattern as received by the image sensor. While described herein in the context of a depth camera, it will be understood that an optical device utilizing a laser diode may be utilized in any other system. Examples include, but are not limited to, telecommunication systems, measuring instruments, scanning devices, monitoring devices, reading devices, etc.

As shown in the environment 100 of FIG. 1, the depth camera 104 may be operatively connected to a computing device 106. While the computing device 106 is shown in FIG. 1 as a video game console, it will be understood that the optical device may be operatively connected with any other suitable computing device. Examples include, but are not limited to, a personal computer, a mobile computing device, a smart phone, a tablet computer, etc.

The computing device 106 further may be operatively connected to a display device 108. The computing device 106 may provide signals to the display device 108 to display viewable content, such as a video game and/or other content, on a display 110. Accordingly, a user 112 may provide input to the computing device via gestures, postures, facial recognition, and/or other inputs detectable via the depth camera 104, and such inputs may be used to control the display of content on the display 110.

Figure 2:
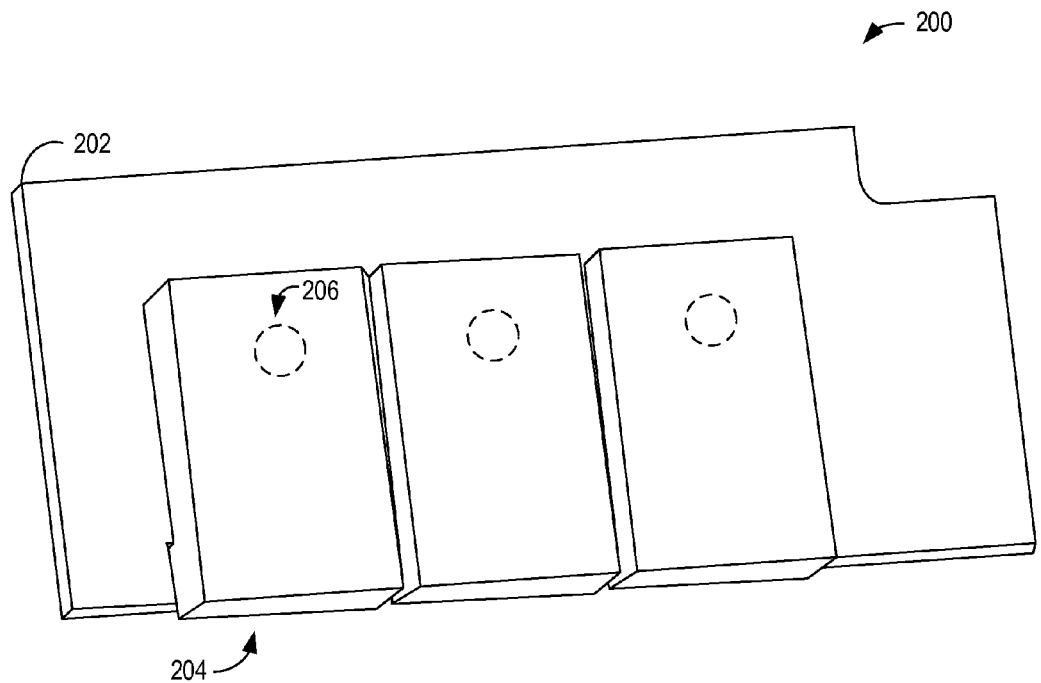
FIG. 2 shows a front side of a printed circuit board of an optical assembly in accordance with an embodiment of the present disclosure.

The depth camera 104 may include an optical assembly for providing one or more of the functionalities described above. FIG. 2 shows an embodiment of an optical assembly 200 including a printed circuit board (PCB) 202. FIG. 2 shows a front side or surface of the printed circuit board 202, wherein the term "front" signifies a side on which one or more laser diodes are disposed. The optical assembly 200 further includes a plurality of couplers 204 mounted to the printed circuit board 202, wherein each coupler thermally couples a laser diode to a heat sink located on a back side of printed circuit board 202. Each coupler 204 includes an opening 206 within which a laser diode package is located, as described in more detail with respect to FIG. 4. The opening 206 provides an outlet for light emitted by the laser diode package to exit the optical assembly.

As shown in FIG. 2, the couplers 204 are mounted to the front side of the printed circuit board 202 adjacent one another in relatively close proximity. In other embodiments, the couplers 204 may be mounted to the printed circuit board 202 in any other suitable arrangement. The couplers 204 may be mounted and/or otherwise attached to the printed circuit board by any suitable mechanism or combination of mechanisms, such as an adhesive, mechanical connector(s), press fit/frictional fit, etc.

Figure 3:
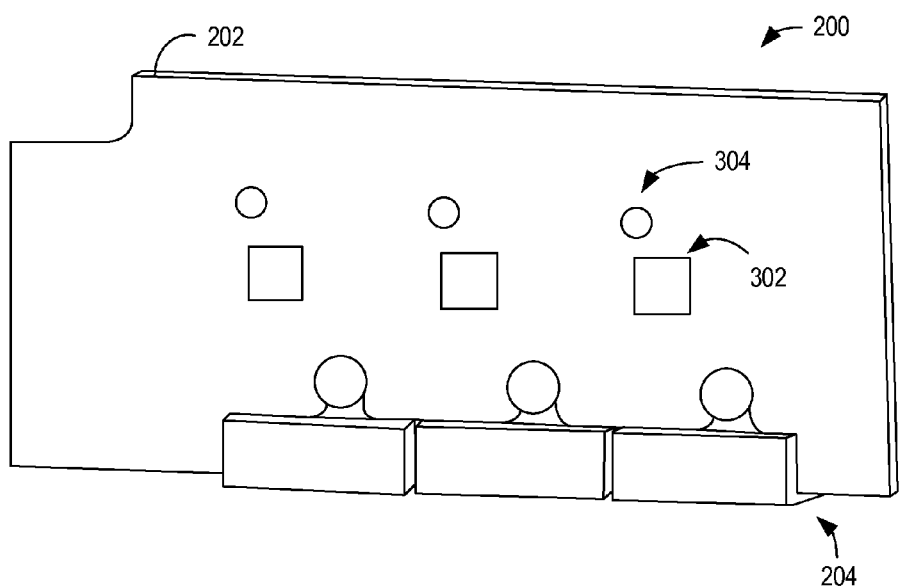
FIG. 3 shows a back side of the printed circuit board of FIG. 2 in accordance with an embodiment of the present disclosure.

FIG. 3 shows a laser diode driver 302 mounted to the back side of the printed circuit board 202 according to an embodiment of the present disclosure. FIG. 3 also shows the couplers 204 as extending around a side of the printed circuit board 202, wherein the term "side" signifies any surface of the printed circuit board that extends between the front side and the back side of the printed circuit board 202. In the depicted embodiment, the couplers 204 extend around a side edge of the printed circuit board 202 by extending through notches formed in the side edge. In other embodiments, a coupler may extend through a side of the printed circuit board in the form of a hole or opening formed within an interior portion of the printed circuit board. It will be understood that the printed circuit board 202 may include any suitable structure to accommodate the couplers 204. The printed circuit board 202 further may include holes and/or other receptacles 304 for mounting couplers 204, a heat sink, or other structures.

Figure 4:
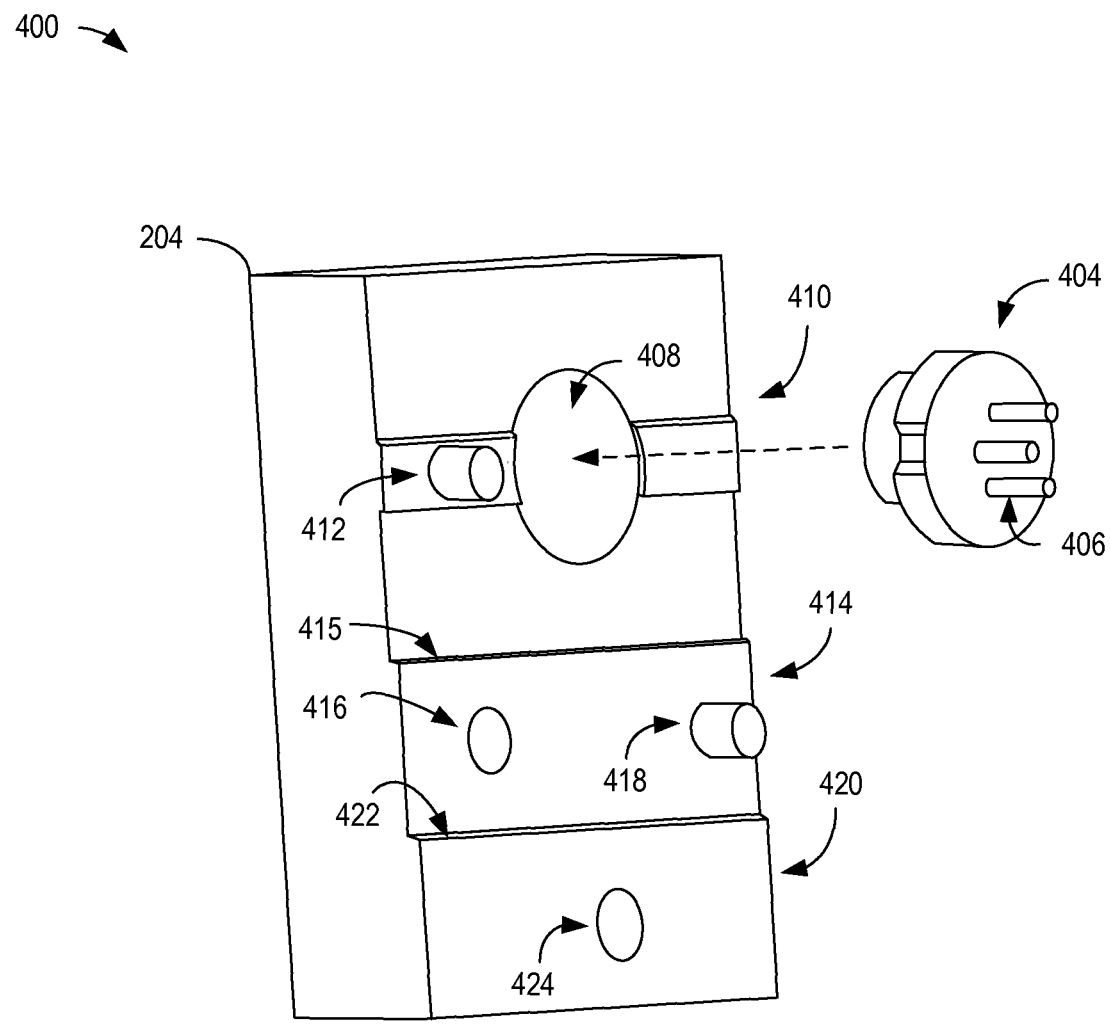
FIG. 4 shows a perspective view of the laser diode coupler of FIG. 2 and a laser diode package in accordance with an embodiment of the present disclosure.

FIG. 4 illustrates a perspective view of an embodiment of an optical assembly 400 including the coupler 204 and a laser diode package 404. While described herein as holding a laser diode package, it will be appreciated that a coupler may hold any other suitable heat-producing element, such as a light emitting diode.

The laser diode package 404 is inserted into a receptacle 408 positioned within a first portion 410 of the coupler 204, wherein the receptacle comprises an opening for allowing light to be projected out of the optical assembly and into a use environment. The laser diode package 404 further includes electrical leads 406 for electrically connecting the laser diode package 404 to a laser diode driver, such as the laser diode driver 302 of FIG. 3.

The first portion 410 of the coupler 204 is configured to be spaced from a printed circuit board when the coupler is mounted to the printed circuit board, and also to help hold the laser diode package spaced from the printed circuit board. The first portion 410 may also include a fastening element 412 for fastening the coupler 204 to a printed circuit board to maintain the desired spacing between the first portion 410 of the coupler 204 and the printed circuit board. The fastening element 412 may be configured to be inserted or otherwise secured to receptacle 304 of FIG. 3.

The coupler 204 further includes a second portion 414 comprising a step 415 configured such that the second portion 414 contacts a printed circuit board to maintain the first portion 410 spaced from the printed circuit board. For example, the second portion 414 may be thicker than the first portion 410 and the step 415 may be formed due to the differential thickness between the first portion 410 and the second portion 414, or may have any other suitable configuration to form the step 415. In the depicted embodiment, the second portion 414 includes a receptacle 416 and a fastener 418 for interfacing with corresponding structures on a printed circuit board, but it will be understood that the coupler may include any other suitable structures for interfacing with the printed circuit board.

The coupler 204 further comprises a third portion 420 comprising another step 422 such that the third portion 420 may extend around a side of a printed circuit board. The step 422 may have any suitable configuration (e.g. a right angle to adjacent surfaces, a sloped configuration relative to adjacent surfaces, etc.), and may contact or be spaced from a side of the printed circuit board. For example, in some embodiments, the third portion 420 may be thicker than the second portion 414 and the step 422 may be formed due to the differential thickness between the second portion 414 and the third portion 420. In other embodiments, the step structure may be formed in any other suitable manner. The third portion 420 may further include a receptacle 424 or other suitable structure for interfacing with a complementary structure on a printed circuit board. It will again be understood that any suitable arrangement and number of receptacles, fasteners, and/or other connecting structures may be provided on one or more of the elements described herein.

The stepped configuration of the coupler 204 provides a thermal path for heat emitted from the laser diode package 404 that extends around a side of the printed circuit board, rather than directly through the printed circuit board to a thermal path utilized by the laser diode driver. A step height between the first portion 410 and the second portion 414, as well as a distance between the laser diode package 404 and the step 415 separating the first portion 410 and the second portion 414, may be designed to provide a targeted amount of thermal insulation between the laser diode package 404 and the printed circuit board.

Figure 5:
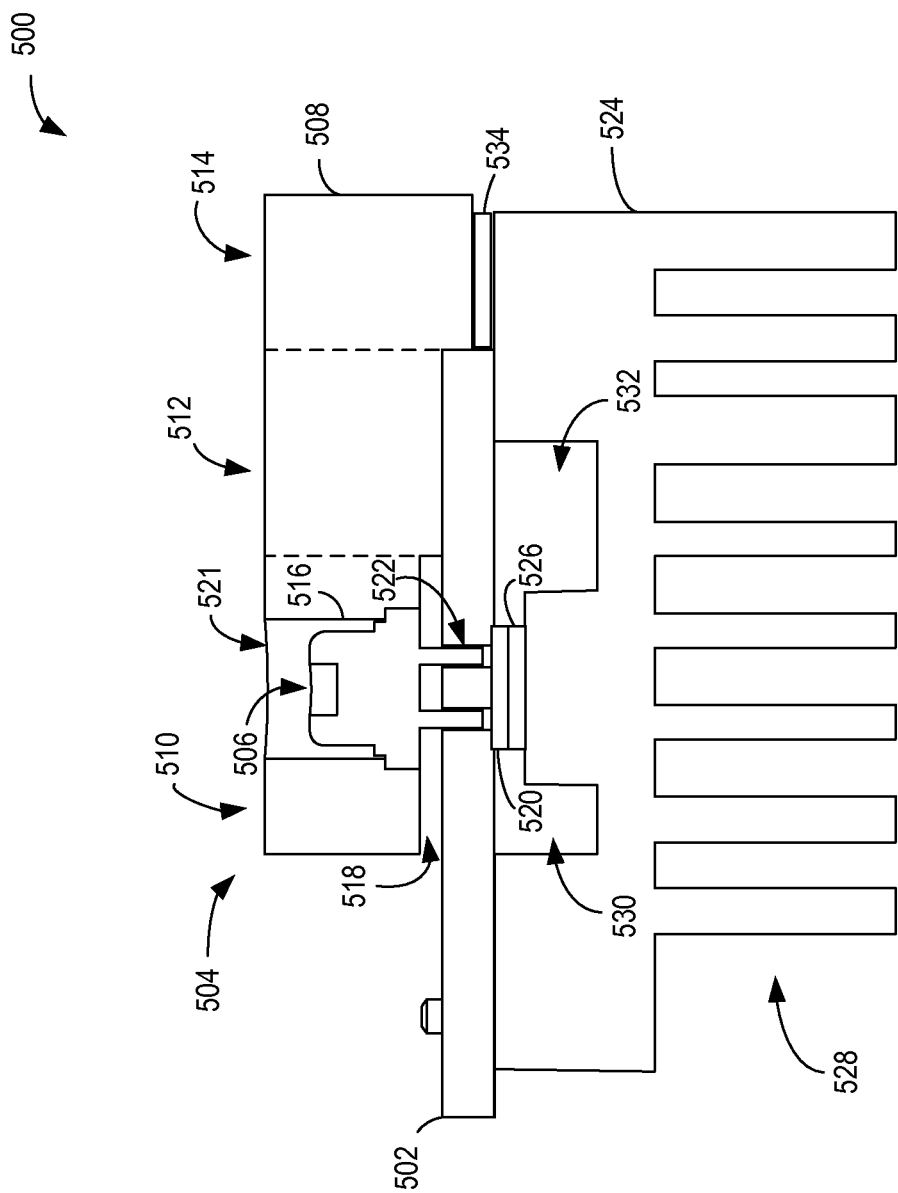
FIG. 5 shows a cross-section view of an optical assembly in accordance with an embodiment of the present disclosure.

FIG. 5 shows a cross-section of an embodiment of an optical assembly 500. The optical assembly 500 includes a printed circuit board 502, a coupler 504 mounted to the printed circuit board 502, and a laser diode package 506 located within the coupler 504. As described above, the coupler 504 may include a first portion 510, a second portion 512, and a third portion 514, which are designated by respective areas between dashed lines. It will be understood that the three portions may be formed from a single piece of material or otherwise integrated together.

As shown in FIG. 5, the first portion 510 includes a receptacle 516 for accommodating the laser diode package 506, and is spaced from the printed circuit board 502 via a gap 518 to thermally insulate the printed circuit board 502 and a laser diode driver 520 from the laser diode package mounted within the coupler 504. The receptacle 516 includes an opening 521 extending from the receptacle 516 through the coupler 504 to pass light emitted by the laser diodes. The receptacle 516 may be configured to match the laser diode package 506 closely in shape to help insure good thermal conductivity between the laser diode package 506 and the coupler 504. The electrical leads 522 of the laser diode package 506 may extend through the gap 518 between the printed circuit board 502 and the laser diode package 506 to electrically connect to the laser diode driver. The gap 518 may comprise any suitable material for thermally decoupling the laser diode package 506 from the printed circuit board 502. In some embodiments, the gap 518 may be an air gap. In other embodiments, another thermally insulating material may be included in the gap 518.

As illustrated, the laser diode package 506 is positioned on an opposite side of the printed circuit board 502 from the laser diode driver 520. In some embodiments, the laser diode package 506 and/or the coupler 504 may be positioned directly opposite the laser diode driver to help shorten the leads 522 and reduce inductance relative to other placements of the laser diode package 506. In other embodiments, the laser diode driver and laser diode package may be laterally offset by a suitable amount.

The laser diode driver 520 may be coupled to a heat sink 524 via a thermally conductive interface material 526 positioned between the heat sink 524 and the laser diode driver 520. The thermally conductive interface material 526 may include any suitable material for providing a thermally conductive path between the laser diode driver 520 and the head sink 524. Heat from the laser diode driver 520 may be conducted toward fins 528 of the heat sink 524 for dissipation away from the optical assembly 500.

The heat sink 524 may directly contact and/or interface with one or more locations on the back side of the printed circuit board 502. In some embodiments, a portion of the heat sink 524 that contacts the printed circuit board may be spaced via a first gap 530 from the portion of the heat sink 524 that receives heat from the laser diode driver, and thus contact the printed circuit board 502 at a first location spaced from the laser diode driver 520. The heat sink 524 may also contact the printed circuit board 502 at a second location spaced from the laser diode driver 520 via a second gap 532, such that the laser diode driver 520 may be positioned between the first gap 530 and the second gap 532. The first gap 530 and the second gap 532 may comprise any suitable material for thermally decoupling the laser diode driver 520 from the printed circuit board 502 and/or other elements of the optical assembly 500, including but not limited to air.

The heat sink 524 may be coupled to the coupler 504 via a thermal interface material 534 positioned between the coupler 504 and the heat sink 524. In some embodiments, the heat sink 524 may couple with the coupler 504 adjacent the second location of contact between the heat sink 524 and the printed circuit board 502. In the depicted embodiment, the third portion 514 of the coupler 504 extends around a side of the printed circuit board 502 and interfaces with the heat sink 524 to provide a second thermal path, different from the first thermal path, for conducting heat from the laser diode package 506. The second gap 532 may be larger than the first gap 530 to help thermally isolate the thermal paths from laser diode driver and the laser diode package to the heat sink. While FIG. 5 illustrates one coupler assembly and corresponding laser diode driver for clarity, it will be understood that some embodiments may comprise a plurality of coupler assemblies and corresponding laser diode mounted to a printed circuit board.

Figure 6:
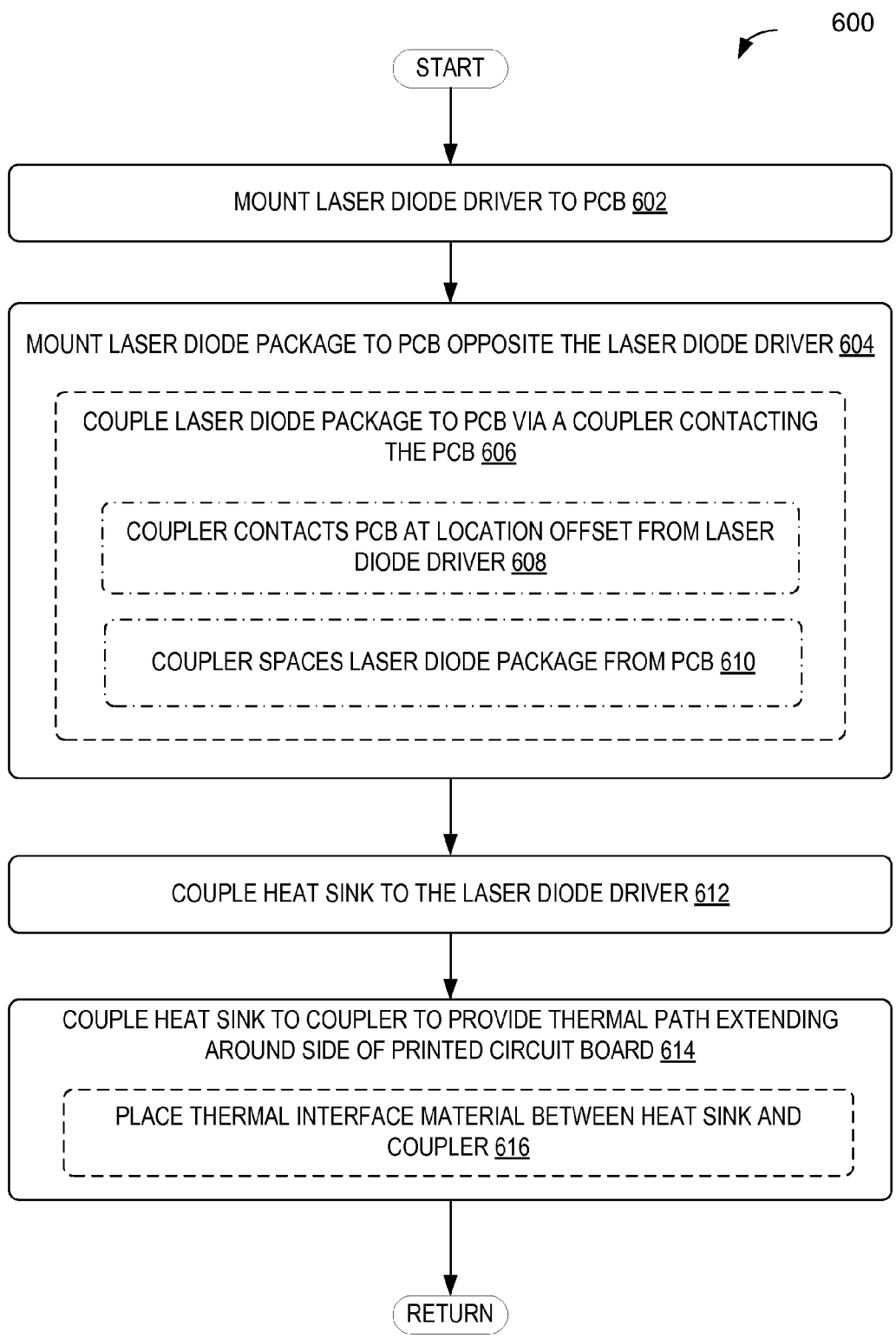
FIG. 6 is a flow chart of a method of manufacturing an optical assembly in accordance with an embodiment of the present disclosure.

FIG. 6 shows an embodiment of a method 600 of manufacturing an optical assembly. Method 600 comprises, at 602, mounting a laser diode driver to a printed circuit board, and at 604, mounting a laser diode package to the printed circuit board. For example, the laser diode driver may be mounted to a back side of the printed circuit board, while the laser diode package is mounted to the front side of the printed circuit board. The method further includes coupling the laser diode package to the printed circuit board via a coupler contacting the printed circuit board, as indicated at 606. The coupler may contact the printed circuit board at a location laterally offset from the laser diode driver, as indicated at 608, and may help to space the laser diode package from the printed circuit board, as indicated at 610.

Method 600 may further include coupling a heat sink to the laser diode driver at 612. This may provide a first thermal path to conduct heat from the laser diode driver for dissipation. Further, as indicated at 614, method 600 may include coupling the heat sink to the coupler to provide a second thermal path extending around a side of the printed circuit board, as described above with regard to FIG. 5. Additionally, as indicated at 616, method 600 may optionally include placing a thermal interface material between the heat sink and the coupler. For example, the thermal interface material may ensure a path of low thermal resistance from the coupler to the heat sink in order to allow heat to be conducted from the laser diode package, around the printed circuit board, to the heat sink. Method 600 may be repeated in order to mount a plurality of laser diode drivers and a plurality of corresponding laser diode packages and couplers to the printed circuit board. Each laser diode package may have a corresponding coupler providing a thermal path to the heat sink.

The embodiments described herein thus provide separate thermal paths for cooling the laser diode package and laser diode driver. By separating these paths while maintaining a close proximity between electrically connected components of these elements, thermal efficiency may be maintained while mitigating inductive losses. The configuration may allow the use of fewer, or no, thermoelectric coolers and faster performance when compared to configurations that do not include separate thermal paths for closely positioned laser diode packages and corresponding laser diode drivers.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
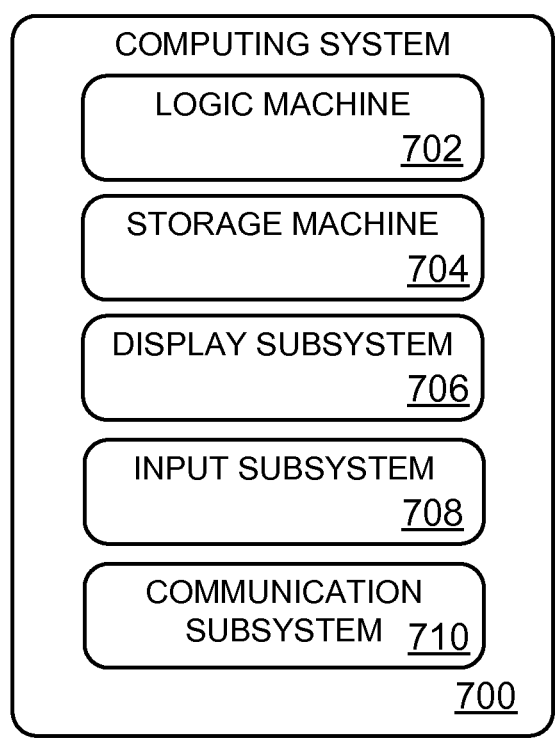
FIG. 7 is a block diagram of an example computing system in accordance with an embodiment of the present disclosure.

FIG. 7 schematically shows a non-limiting embodiment of a computing system 700 that can enact one or more of the methods and processes described above. Computing system 700 is shown in simplified form. Computing system 700 may take the form of one or more gaming consoles, personal computers, control devices, server computers, tablet computers, home-entertainment computers, network computing devices, mobile computing devices, mobile communication devices (e.g., smart phone), and/or other computing devices, including but not limited to computing device 106 of FIG. 1.

Computing system 700 includes a logic machine 702 and a storage machine 704. Computing system 700 may optionally include a display subsystem 706, input subsystem 708, communication subsystem 710, and/or other components not shown in FIG. 7.

Logic machine 702 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage machine 704 includes one or more physical devices configured to hold and/or store machine-readable instructions executable by the logic machine to implement the methods and processes described herein. For example, logic machine 702 may be in operative communication with storage machine 704. When such methods and processes are implemented, the state of storage machine 704 may be transformed—e.g., to hold different data.

Storage machine 704 may include removable and/or built-in devices. Storage machine 704 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage machine 704 may include machine-readable volatile, nonvolatile, dynamic, static, read/write, read-only, random-access, sequential-access, location-addressable, file-addressable, and/or content-addressable devices.

It will be appreciated that storage machine 704 includes one or more physical devices. However, aspects of the instructions described herein alternatively may be propagated by a communication medium (e.g., an electromagnetic signal, an optical signal, etc.) that is not held by a physical device for a finite duration.

Aspects of logic machine 702 and storage machine 704 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 706 may be used to present a visual representation of data held by storage machine 704. This visual representation may take the form of a graphical user interface (GUI). As the herein described methods and processes change the data held by the storage machine, and thus transform the state of the storage machine, the state of display subsystem 706 may likewise be transformed to visually represent changes in the underlying data. Display subsystem 706 may include one or more display devices utilizing virtually any type of technology. Such display devices may be combined with logic machine 702 and/or storage machine 704 in a shared enclosure, or such display devices may be peripheral display devices. For example, display subsystem 706 may include display device 108 of FIG. 1.

When included, input subsystem 708 may comprise or interface with one or more user-input devices such as a keyboard, mouse, touch screen, microphone, or game controller.

For example, input subsystem may include or interface with computing device 106 of FIG. 1. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 710 may be configured to communicatively couple computing system 700 with one or more other computing devices. Communication subsystem 710 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 700 to send and/or receive messages to and/or from other devices via a network such as the Internet.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An optical assembly comprising:
    a printed circuit board;
    a laser diode package mounted to the printed circuit board on a first side of the printed circuit board;
    a laser diode driver mounted to the printed circuit board on a second side of the printed circuit board, the laser diode driver to electrically communicate with the laser diode package through the printed circuit board;
    a heat sink coupled to the laser diode driver, the heat sink configured to provide a first thermal path for conducting heat from the laser diode driver; and
    a coupler coupled to the laser diode package, the coupler including a receptacle inside of which the laser diode package is positioned, and the coupler configured to provide a second, different thermal path for conducting heat from the laser diode package on the first side of the printed circuit board to the heat sink on the second side of the printed circuit board, the second, different thermal path being laterally offset along the printed circuit board from the first thermal path.

2. The optical assembly of claim 1, wherein the coupler is coupled to the heat sink via a thermal interface material that is positioned between the coupler and the heat sink.

3. The optical assembly of claim 1, wherein the laser diode package is positioned directly opposite the laser diode driver.

4. The optical assembly of claim 1, wherein the coupler has a first portion, a second portion, and a third portion, the second portion being thicker than the first portion and the third portion being thicker than the second portion.

5. The optical assembly of claim 4, wherein a side of the first portion facing the printed circuit board is spaced from the printed circuit board and contacts the laser diode package.

6. The optical assembly of claim 4, wherein a side of the second portion facing the printed circuit board directly contacts the first side of the printed circuit board.

7. The optical assembly of claim 4, wherein the third portion extends around the first side of the printed circuit board and interfaces with the heat sink.

8. The optical assembly of claim 1, wherein one or more leads of the laser diode package extend into the printed circuit board to make electrical contact with the laser diode driver.

9. The optical assembly of claim 1, further comprising a plurality of laser diode packages and a corresponding plurality of couplers mounted to the printed circuit board.

10. The optical assembly of claim 1, wherein the heat sink is coupled to the laser diode driver via a thermal interface material positioned between the heat sink and the laser diode driver.

11. An optical assembly comprising:
a printed circuit board;
a laser diode package mounted to a front surface of the printed circuit board;
a laser diode driver mounted to a back surface of the printed circuit board;
a heat sink coupled to the laser diode driver to provide a first thermal path for dissipating heat from the laser diode driver; and
a coupler coupled to the laser diode package and to the heat sink, the coupler configured to provide a second, different thermal path to conduct heat from the laser diode package around a side of the printed circuit board to the heat sink.

12. The optical assembly of claim 11, wherein the laser diode package is spaced from the printed circuit board.

13. The optical assembly of claim 11, wherein a first portion of the heat sink is coupled to the laser diode driver via a thermal interface material and a second portion of the heat sink contacts the printed circuit board.

14. The optical assembly of claim 13, wherein the second portion of the heat sink is spaced via a first gap from the first portion of the heat sink and contacts the printed circuit board at a first location spaced from the laser diode driver.

15. The optical assembly of claim 14, wherein the heat sink contacts the printed circuit board at a second location spaced from the laser diode driver via a second gap, the laser diode driver being positioned between the first location and the second location.

16. The optical assembly of claim 11, wherein a first portion of the coupler is spaced from the printed circuit board and contacts the laser diode package, a second portion of the coupler adjacent to the first portion directly contacts the printed circuit board, and a third portion of the coupler adjacent to the second portion extends around a side of the printed circuit board and couples with the heat sink.

17. A method of manufacturing an optical assembly, the method comprising:
mounting a laser diode driver to a printed circuit board;
mounting a laser diode package to the printed circuit board directly opposite the laser diode driver, the laser diode package being coupled to the printed circuit board via a coupler that contacts the printed circuit board in a location laterally offset from the laser diode driver, and the laser diode package and coupler being spaced from the printed circuit board at a location directly opposite the laser diode driver; and
coupling a heat sink to the laser diode driver; and
coupling the heat sink to the coupler such that a thermal path from the coupler to the heat sink extends around a side of the printed circuit board.

18. The method of claim 17, further comprising mounting a plurality of laser diode drivers and a plurality of laser diode packages to the printed circuit board, each laser diode package having a corresponding coupler providing a thermal path to the heat sink.

19. The method of claim 17, wherein coupling the heat sink to the coupler further comprises placing a thermally conductive interface material between the heat sink and the coupler.

* * * * *